United States Patent
Mehrmanesh et al.

(10) Patent No.: US 8,433,274 B2
(45) Date of Patent: Apr. 30, 2013

(54) DYNAMIC GAIN ASSIGNMENT IN ANALOG BASEBAND CIRCUITS

(75) Inventors: Saeid Mehrmanesh, San Jose, CA (US); Vahid Mesgarpour Toosi, Mountain View, CA (US)

(73) Assignee: SiTune Corporation, San Jose, CA (US)

( * ) Notice: Subject to any disclaimer, the term of this patent is extended or adjusted under 35 U.S.C. 154(b) by 436 days.

(21) Appl. No.: 12/728,148

(22) Filed: Mar. 19, 2010

(65) Prior Publication Data

US 2011/0230156 A1 Sep. 22, 2011

(51) Int. Cl.
*H04B 1/06* (2006.01)
*H04B 7/00* (2006.01)

(52) U.S. Cl.
USPC .................... 455/234.2; 455/253.2

(58) Field of Classification Search ............... 455/232.1, 455/234.1, 234.2, 250.1, 251.1, 252.1, 253.2, 455/254; 330/250, 278, 291, 295, 152
See application file for complete search history.

(56) References Cited

U.S. PATENT DOCUMENTS

| | | | |
|---|---|---|---|
| 6,353,364 B1 * | 3/2002 | Klemmer | 330/279 |
| 6,480,063 B2 * | 11/2002 | Ichihara | 330/133 |
| 7,420,410 B2 * | 9/2008 | Ohba | 330/9 |
| 7,634,241 B2 * | 12/2009 | Bagchi | 455/188.1 |
| 2002/0142745 A1 * | 10/2002 | Kang et al. | 455/232.1 |
| 2003/0203727 A1 * | 10/2003 | Kluge et al. | 455/234.1 |
| 2009/0058531 A1 * | 3/2009 | Hwang et al. | 330/278 |

* cited by examiner

*Primary Examiner* — Nguyen Vo
(74) *Attorney, Agent, or Firm* — Novak Druce Connolly Bove + Quigg LLP (57) ABSTRACT

A system and method is provided for filtering and amplifying a signal where amplification can be distributed between stages of a filter and gain can be assigned throughout the filter to optimize system performance. Such a system can be implemented in the baseband section of RF receivers. VGAs can be implemented between filter stages, such as biquads, or VGAs can be incorporated in filter stages. Substantially linear VGAs comprising a parallel resistor array can be incorporated in the circuitry of the filter stages to reduce distortion. Gain can be assigned dynamically in the amplification stages to improve noise and/or linearity performance. For example, gain assignments can be implemented so that high power undesired signal components are filtered out before amplification to prevent component saturation, and low power signals are amplified before they are filtered to improve noise performance.

15 Claims, 8 Drawing Sheets

DYNAMIC GAIN ASSIGNMENT IN ANALOG BASEBAND CIRCUITS

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention relates generally to the field of radio frequency receivers, and more specifically to amplification and filtering of signals in the baseband portion of radio frequency receivers.

BACKGROUND

In recent times, communications devices have become among the most impacting technologies in our society. Cellular phones, PDAs, smart phones, personal media players, laptops, navigation devices, mobile TVs, and myriad others have reshaped the way human beings live their personal and working lives. In turn, the field of communications devices continues to exhibit some of the most rapid technological innovation.

Generally, the capabilities of a communications device are limited by the ability of the device to receive large quantities of information and retrieve quality usable data from the information. A device's ability to perform these functions depends on the performance of the device's receiver. The receiver can receive a radio frequency (RF) signal from an antenna or a wire medium and process the signal to produce a signal that can be used by other portions of the device to carry out the device's functions. Significantly, the amplitude and quality of the signals that are received at the receiver may vary drastically. Namely, due to, for example, attenuation, variation in distance between the receiver and the transmitter, fading, and the Doppler Effect the amplitude of signals received at the receiver can fluctuate rapidly and vary by as much as several magnitudes while the signal can exhibit noise and distortion. A well performing receiver needs to extract quality information from both high quality and low quality signals.

More specifically, a device can receive a RF signal at the receiver through an antenna. The signal can then be amplified and conveyed to a mixer where the signal's frequency can be converted from its carrier frequency that defines its channel in the spectrum to a low frequency, such as a baseband or a low-IF frequency. After the down conversion in frequency, the signal can be amplified and filtered in a section of the receiver referred to as the baseband portion to eliminate unwanted components and produce a signal of a desired power. After the baseband portion, the signal can be converted to the digital domain and conveyed to a digital demodulator where it can be further processed to be used by other components in the device to carry out the device's functions.

However, filtering and amplifying the signal in the baseband portion can degrade signal quality. For example, filtering a low power signal can introduce excessive noise and amplifying a high power signal can produce distortion, particularly if there is saturation of components. Furthermore, a signal received at the baseband portion can contain an undesired signal component, such as an adjacent channel, which can be orders of magnitudes more powerful than the desired signal component. Powerful undesired signal components can further complicate the processing of signals in the baseband portion by causing saturation and distortion. Baseband portions in present devices either fail to meet these needs or meet them in an expensive to implement and power inefficient manner. What is needed is a cost effective and power efficient baseband section that is flexible, dynamic, and intelligent to the presence of undesired signal components while exhibiting good noise and linearity performance for all signals.

DETAILED DESCRIPTION

In the following description, numerous specific details are set forth in order to provide a thorough understanding of the present invention. However, it will be apparent to one skilled in the art that the present invention can be practiced without these specific details. In other instances, well known circuits, components, algorithms, and processes have not been shown in detail or have been illustrated in schematic or block diagram form in order not to obscure the present invention in unnecessary detail. Additionally, for the most part, details concerning communication systems, transmitters, receivers, communication devices, and the like have been omitted inasmuch as such details are not considered necessary to obtain a complete understanding of the present invention and are considered to be within the understanding of persons of ordinary skill in the relevant art. It is further noted that, where feasible, all functions described herein may be performed in either hardware, software, firmware, analog components or a combination thereof, unless indicated otherwise. Certain term are used throughout the following description and claims to refer to particular system components. As one skilled in the art will appreciate, components may be referred to by different names. This document does not intend to distinguish between components that differ in name, but not function. In the following discussion and in the claims, the terms "including"

and "comprising" are used in an open-ended fashion, and thus should be interpreted to mean "including, but not limited to . . . ."

Embodiments of the present invention are described herein. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with applications and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Further, in this specification, it is to be understood that "amplification" can refer to increasing a signal's power in the case of positive amplification, and to decreasing a signal's power, or attenuation, in the case of negative amplification. Hence, the term "attenuation" can be interchangeable with the term "amplification" but for the sake of simplicity, throughout the specification and Claims, only one of the terms "amplification" and "attenuation" may be used and should be understood to encompass either meaning. Also, in this specification and Claims, the terms "baseband section," "analog baseband," "analog baseband portion," and "baseband portion" are used interchangeably and are intended to represent the same parts of a receiver.

In various embodiments, systems and methods are described for filtering and amplifying a signal where amplification can be distributed between stages of a filter and gain can be assigned throughout the filter to optimize system performance. Such a system can be implemented in the baseband section of RF receivers and the benefits of such a system are applicable to the needs of baseband sections of RF receivers. Hence, although certain embodiments of this invention are described in this specification in the context of baseband sections, it will be apparent, to persons of ordinary skill in the art, that the systems and methods described can be implemented in other devices and areas of technology, and that, where applicable, embodiments described in the context of baseband sections can be implemented in other devices or portions of devices not explicitly referred to here.

In various embodiments, amplification can be distributed between stages of a filter and gain can be assigned throughout the filter to optimize system performance. For example, variable gain amplifiers (VGAs) can be implemented between stages of a filter, such filter stages can be biquads, or VGAs can be incorporated in stages of a filter, such as variable components incorporated in biquads. Substantially linear VGAs comprising a parallel resistor array can be incorporated in the circuitry of the filter stages to reduce distortion. Gain can be assigned dynamically in the amplification stages to improve noise and/or linearity performance of the filter and amplification system. For example, gain assignments can be implemented so that high power undesired signal components are filtered out before amplification to prevent component saturation, and low power signals are amplified before they are filtered to improve noise performance.

In various embodiments, systems and methods are described for handling signals in a receiver and in the analog baseband portion of a receiver. Signals can be amplified and filtered in the baseband portion of a receiver. The baseband can contain one or more filters. The filters can be low pass filters or high pass filters. Each filter can comprise VGA stages, filter stages, or Combination stages that contain filter stages incorporating a VGA. A filter stage can be any independent filter portion, such as a biquad. A Combination stage can be any independent filter portion, such as a biquad, further incorporating a VGA. In an embodiment, the VGA incorporated in a Combination stage can be a variable resistor located in the circuitry of the Combination stage so that the gain of the Combination stage varies with variation in the resistance level of the variable resistor. Combining a VGA stage and a filter stage in a Combination stage can have the advantage of being more compact, as well as reducing noise and distortion by reducing the total number of stages that the signal is processed in because noise and distortion can increase as the total number of stages increases. For the sake of simplicity, both VGA stages and Combination stages may be referred to as "amplification stages" in this specification and Claims.

Signal power can be measured at the input and the output of the baseband portion, as well as between the various amplification and filter stages. Based on the measured signal power, the total needed gain and the power of undesired signal components, such as an adjacent channel, and desired signal components, such as the main channel, can be estimated. A gain assignment can be produced in the baseband components based on the needed gain, the input signal power, the output signal power, the estimated power of undesired signal components, and/or the estimated power of desired signal components. Gain assignments can be implemented so that in the case of high power undesired signal components at the input, gain can be distributed in the amplification stages so that undesired signal components are at least partially removed through filtering before the signal is amplified, which can avoid component saturation; and in the case of low power signals, gain can be distributed in the amplification stages so that the signal is at least partially amplified before it is filtered to reduce noise that can be introduced when a weak signal passes through stages.

Figure 1:
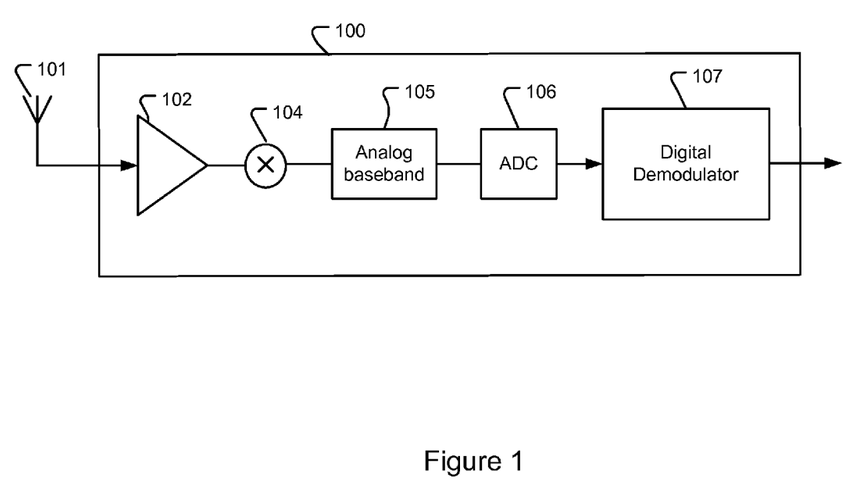
FIG. 1 shows an example of a RF receiver with an analog baseband portion, in accordance with various embodiments.

FIG. 1 shows an example of a RF receiver with an analog baseband portion, in accordance with various embodiments. A RF signal can be received at an antenna 101 and conveyed to a RF receiver 100. The signal can be amplified in an amplifier stage 102 and conveyed to a mixer 104. In the mixer 104, the signal can be converted to a low frequency, such as a baseband or an intermediate frequency. After the mixer 104, the signal can be conveyed to an analog baseband portion 105, where the signal can be filtered and amplified to remove undesired signal components such as blockers and/or adjacent channels and produce a desired signal with preferred power. After the analog baseband portion 105, the signal can be conveyed to an analog to digital converter (ADC) 106 where the signal can be converted to the digital domain. The digital signal can be conveyed to a digital demodulator 107 for further processing.

Generally, the signal that is conveyed from the mixer to the baseband portion can exhibit unfavorable attributes that can be corrected in the baseband portion before the signal is conveyed to subsequent components of the receiver. For example, the signal may contain undesired components, such as blockers and adjacent channels. Also, the signal's amplitude may be too low or too high. In the baseband section, undesirable components can be removed or substantially reduced through filtering. Signal power can be adjusted by amplifying the signal in one or more amplification stages.

For example, the signal conveyed to the baseband section can range in power from 0 dBm to −60 dBm. Passing low power signals though stages, such as signals of power below −40 dBm, can introduce excessive noise. Thus, it can be preferable to amplify such low power signals early in the baseband section. Passing high power signals through stages, such as signals of power higher than −20 dBm, can cause component saturation and introduce distortion or non-linearity.

In addition, the signal conveyed to the baseband section can contain a desired component, such as the desired channel, and undesired components, such as adjacent channels and/or blockers. An adjacent channel can be a signal in a frequency range that is immediately above or below the desired channel in the frequency range. A blocker can be a signal that is above or below the desired channel in the frequency range but not immediately next to it. A signal can contain a weak undesired signal component, for example, an undesired signal component of a power that is equal to or less than the power of the desired signal component. A signal can also contain an extremely strong undesired signal component, for example, an undesired signal component of a power that is 50 times greater than the power of the desired signal component.

In one scenario, a signal received at the baseband portion can contain a high power undesired signal component, such as a high power adjacent channel. If the signal is amplified before the signal is filtered, the power of the signal may become large and saturate subsequent components in the system, resulting in loss of information. Saturation occurs when high power signals pass through components and cause distortion of the signal. Hence, it can be favorable to filter such a signal to remove undesirable components prior to amplifying the signal. In another scenario, the desired component and the undesired component of a signal received at the baseband portion can be low power. If the signal is filtered before it is amplified, unnecessary noise can be introduced into the signal because filtering a weak signal can introduce noise. Hence, it can be favorable to amplify such a signal prior to filtering the signal.

Thus, in certain scenarios, it can be favorable to perform more amplification before filtering and in other scenarios it can be favorable to perform more amplification after filtering. However, if a VGA is placed before a filter, then amplification will always be performed before filtering. Conversely, if a VGA is placed after a filter, then amplification will always be performed after filtering. What is needed is a system and method for separating the gain and filter stages so that gain can be applied gradually during filtering and so that gain can be distributed throughout the filtering stages according to performance needs. As will be seen, this invention meets this need in an elegant manner.

Thus, depending on the particular signal properties, or depending on whether noise or linearity of the produced signal is the primary concern, different amplification and filtering schemes, or "gain assignments" can be employed to optimize performance of the baseband section. In one embodiment, for a signal with a high power adjacent channel, linearity can be the primary concern; for a signal with a low power desired channel, noise can be the primary concern. For example, if the signal contains a strong undesired signal component, signal quality can be optimized by applying a gain assignment under which most filtering is performed before full amplification. Conversely, if the desired component of the signal is weak, signal quality can be optimized by applying a gain assignment under which most of the amplification is performed before the filtering. As will be discussed in further detail below, a continuum of gain assignments can be implemented between a gain assignment that is fully optimized for noise and a gain assignment that is fully optimized for linearity, based on the desired balance of noise and linearity performance for a particular signal.

In various embodiments, the baseband portion can contain a series of at least one filter. At least one of the filters can comprise a series of filter stages, VGA stages, and/or Combination stages. The order of filter stages, VGA stages, and Combination stages in the series can alternate and the gain assignment in the stages can be altered by distributing the total amount of desired amplification in the VGA and/or Combination stages. For instance, a gain assignment can be implemented in a filter comprising a filter stage located between two VGA stages, a filter comprising two Combination stages, or a filter comprising a Combination stage and a VGA stage.

For example, a filter in the baseband portion can comprise a first VGA stage, a first filter stage, and a second VGA stage. If the signal contains a strong undesired signal component, then a gain assignment can be chosen for performing less amplification in the first VGA than the second VGA. Hence, when there is a strong undesired component in the signal, the undesired component can be filtered out of the signal in the first filter before the majority of the amplification is performed. As described, filtering such a signal before performing the majority of the amplification can prevent saturation of system components that could happen if a signal with a strong undesired component is amplified. If the signal contains a weak desired signal component, then a gain assignment can be chosen for performing more of the amplification in the first VGA stage than the second VGA stage. Hence, when there is a weak desired component in the signal, the signal can be amplified before it is filtered. Amplifying such a signal before filtering it can prevent noise that would be created by filtering a low power signal. Similarly, the filter can contain more VGA stages and filter stages, for example, the above mentioned series can contain a second filter stage, and a third VGA stage. Likewise, gain assignment in the additional VGA stages can be selected according to the performance requirements of the baseband section.

Figure 2:
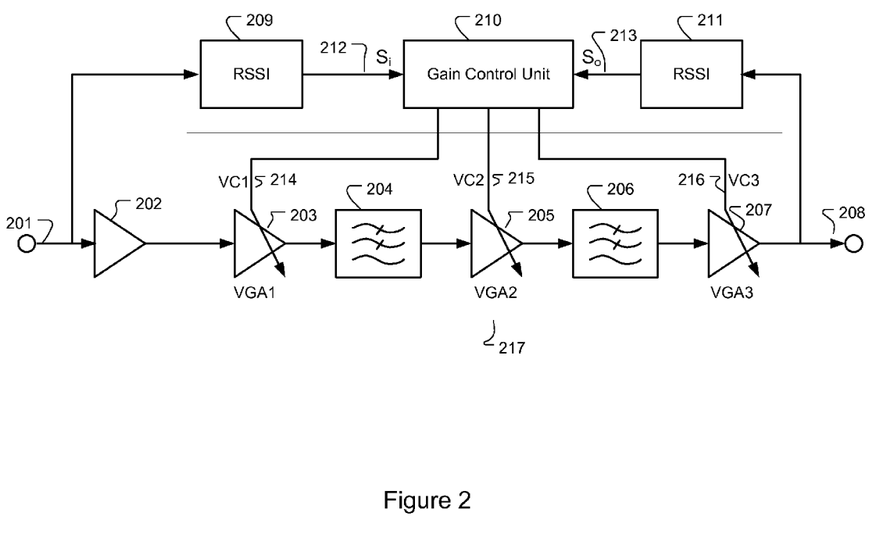
FIG. 2 shows an example of a baseband section comprising a filter containing three VGA stages and two filter stages, in accordance with one embodiment.

FIG. 2 shows an example of a baseband section comprising a filter containing three VGA stages and two filter stages, in accordance with one embodiment. An incoming signal 201 can be conveyed to the baseband portion after it is processed in a mixer. In the baseband portion, the signal can be conveyed to a first received signal strength indicator (RSSI) 209 that can measure the signal power. After the RSSI 209, the signal can be conveyed to a pre-amplifier stage 202, which pre-amplifier stage 202 can produce a fixed amount of amplification of the signal. After the pre-amplifier stage, the signal can be conveyed to a filter 217. In the filter, the signal can be conveyed to a first VGA stage (VGA1) 203, a first filter stage 204, a second VGA stage (VGA2) 205, a second filter stage 206, and a third VGA stage (VGA3) 207. After the filter 217, the signal can be conveyed to a second RSSI 211 that can measure the power of the produced signal. In one embodiment, the signal can be conveyed to an analog second RSSI 211. In another embodiment, the signal can be converted to digital in an analog to digital converter and conveyed to a digital second RSSI 211. In yet another embodiment, the signal can be converted to digital in an analog to digital converter and be conveyed to a digital second RSSI 211 that is incorporated in a digital demodulator, which digital demodulator can be located after the baseband section, for example, as illustrated in FIG. 1. The first RSSI 209 can convey a power measurement, $S_i$ 212, corresponding to incoming signal power, to a Gain Control Unit 210. The second RSSI 211 can convey a power measurement, $S_o$ 213, corresponding to output signal power, to the Gain Control Unit 210. Based on the received power measurements $S_i$ 212 and $S_o$ 213, the Gain Control Unit 210 can adjust the gain in the three VGA stages 203, 205, 207 according to logic, executable logic, or analog circuitry incorporated in the Gain Control Unit 210 by sending control voltage signals VC1 214, VC2 215, and VC3 216 to the three VGA stages, respectively. The components may be electronically connected as illustrated.

It should be noted that while the example illustrated in FIG. 2 shows a baseband section with a single filter, in various embodiments, the baseband section can contain several filters, some of which filters may contain several VGA stages and/or Combination stages and some of which filters may be filters not incorporating VGA stages or Combination stages.

In one embodiment, the Gain Control Unit 210 can select a gain assignment based on an estimate of the power of an undesired signal component and/or an estimate of the power of a desired signal component. For example, the Gain Control Unit 210 can estimate the power of an undesired signal component and the power of a desired signal component based on the input signal power $S_i$ 212, the output signal power $S_o$ 213, and the total amount of amplification (G) applied to the signal in the amplification stages.

In various embodiments, the power of the desired component of the signal and the power of the undesired component of the signal can be estimated by comparing a predicted power of the signal after the signal is amplified and filtered with a measured power of the signal after the signal is amplified and filtered ($P_o$). For example, the predicted power of the signal can be determined by measuring a power of the signal before the signal is amplified and filtered ($P_i$), such as the input signal power measurement $S_i$ 212 in FIG. 2, and applying a function of the amplification applied in the amplification and filtering stages to the measured power of the signal, which amplification function can estimate the power of the signal after the signal is amplified and filtered based on the power of the signal before the signal is amplified and filtered and based on the amount of amplification applied to the signal in the amplification and filtering. Namely, the applied function $f(G, P_i)$ can estimate the power of the signal produced in the amplification and filtering based on the total amount of amplification applied, G, and the input signal power $P_i$. Hence, in a case where no signal power is filtered out in the amplification and filtering, $P_o = f(G, P_i)$, where $P_o$ is the measured power of the signal after the signal is amplified and filtered. Hence, if $P_o = f(G, P_i)$, then there is no appreciable undesired signal component and P, approximates the power of the desired signal component. If, however, an undesired component is present in the incoming signal, then some of that signal, and the corresponding power, can be filtered out and $f(G, P_i)$ will be higher than the measured output signal power $P_o$, with the difference representing the power of the adjacent channel. That is, if $f(G, P_i) > P_o$, then the incoming signal can contain an undesired signal component that can be represented by the difference between $f(G, P_i)$ and $P_o$. Further, if the undesired signal component is relatively high power, then a gain assignment can be selected to produce good linearity performance. If the desired signal component is relatively low power, then a gain assignment can be selected to produce good noise performance. Further, a continuum of gain assignments between a linearity optimized gain assignment and a noise optimized gain assignment can be implemented when both linearity and noise performance are desired.

In one embodiment, the amplification function $f(G,P_i)$ can be defined as the product of G and $P_i$, or $f(G,P_i) = G \times P_i$. Hence, in the example illustrated in FIG. 2, if the input signal consists of only a desired signal component, then the product of the input signal power $S_i$ and the total amplification G, will be the output signal power $S_o$. That is, if $S_o = S_i \times G$, then there is no appreciable undesired signal component and $S_i$ approximates the power of the desired signal component. If, however, an undesired component is present in the incoming signal, then some of that signal, and the corresponding power, will be filtered out and the product of the input signal power $S_i$ and the total amplification G, will be higher than the output signal power $S_o$, with the difference representing the power of the adjacent channel. That is, if $S_i \times G > S_o$ then the incoming signal can consists of a desired signal component approximately of a power $S_o/G$ and an undesired signal component approximately of a power $S_i - S_o/G$. Hence, if the undesired signal component is high power, then a gain assignment can be selected to produce good linearity performance. If the desired signal component is low power, then a gain assignment can be selected to produce good noise performance. Further, a continuum of gain assignments between a linearity optimized gain assignment and a noise optimized gain assignment can be implemented when both linearity and noise performance are desired.

Further, because the measured input signal power, such as $S_i$ or $P_i$ in the above examples, corresponds to the sum of the power of the desired signal component and the undesired signal component, once one of the signal component powers is estimated, the power of the other component can be estimated by subtracting the power of the estimated signal component from the measured input signal power.

In one embodiment, the Gain Control Unit 210 can select a gain assignment based on the measured input signal power, such as $S_i$ 212 in FIG. 2. For example, if the input signal power is low, then a gain assignment can be selected to produce good noise performance. Alternatively, if the input signal power is high, then a gain assignment can be selected to produce good linearity performance. Namely, because a low input signal power can indicate that the desired signal component is of low power, a gain assignment with good noise performance can be selected to produce a signal with good noise characteristics. Further, because a powerful signal can produce non-linear components when the signal passes through filter stages, a gain assignment with good linearity performance can be selected to produce a signal with good linearity characteristics when the input signal power is high.

Further, in various embodiments and by example in the embodiments illustrated in FIG. 2, the Gain Control Unit 210 can fix the power of the output signal 208 in a continuous feedback loop based on the output signal power $S_o$ 213. For example, the output signal power $S_o$ 213 can be conveyed to the Gain Control Unit 210 and compared to a predetermined fixed value. If the signal power $S_o$ 213 is lower than the predetermined fixed value, then the Gain Control Unit 210 can increase the total amount of amplification in the VGA stages. Conversely, if $S_o$ 213 is higher than the predetermined fixed value, then the Gain Control Unit 210 can decrease the total amount of amplification in the VGA stages. This can be performed continuously to substantially fix the power of the output signal 208. In various embodiments, the Gain Control Unit 210 can be programmed to change the predetermined, fixed value that is compared to the output signal power $S_o$ 213 in the feedback loop to change the power of the produced output signal 208.

Hence, in various embodiments, based on the output signal power $S_o$ 213, the Gain Control Unit 210 can determine the total amount of amplification that will be applied in a gain assignment. Further, while the total amount of amplification can be determined based on the output signal power $S_o$ 213, the distribution of total gain in the VGA stages can be determined based on noise and linearity requirements, which requirements can depend on parameters such as the input signal power $S_i$ 212, the power of the undesired signal component, and/or the power of the desired signal component.

Thus, after determining performance requirements, and the total amount of required gain, the Gain Control Unit 210 can produce a corresponding gain assignment in the amplification stages. For example, if a low power signal is measured, more amplification can be performed in VGA1 than VGA2, and more amplification can be performed in VGA2 than VGA3. As described previously, in situations with a low power signal, it can be favorable to perform more amplification in the initial VGAs to improve noise performance. Conversely, if a high power undesirable component is estimated, less amplification can be performed in VGA1 than VGA2, and less amplification can be performed in VGA2 than VGA3. As described previously, in situations with a high power undesired signal component, it can be favorable to perform less amplification in the initial VGA stages so the high power undesired signal component can be filtered out before full amplification is applied to prevent saturation of system components.

As will be apparent to persons of reasonable skill in the art, the principles and concepts of gain assignment described above and below in the context of defined configurations, such as the configuration of FIG. 2, can be applied in alternative configurations containing different types and/or quantities of components. For example, concepts such as adjacent channel power estimation, gain distribution, and fixing produced signal power described above can be applied in configurations containing several more amplification stages and filtering stages than in the example of FIG. 2.

In one embodiment, a gain assignment can be produced by setting the gain in each amplification stage in a set consecutively; starting with the first amplification stage in the set and proceeding to the last amplification stage. Amplification can be increased in an amplification stage until a maximum preferred level of gain in the respective amplification stage is reached or the power of the signal at the output of the amplification stage reaches a predetermined maximum power level. After one of these conditions is met, amplification can be increased in the next amplification stage, until the conditions are met in that stage. Amplification can continue to be increased under the same two conditions in each consecutive amplification stage in the series until a desired combined amount of total amplification is reached in all amplification stages, or all amplification stages are at the maximum preferred level of gain. The gain in each stage can be continuously adjusted to meet the mentioned conditions, for example, in a feedback loop. In one embodiment, RSSI units can be located after each amplification stage to measure the power of the signal after the respective amplification stage. By controlling the power of the signal at the output of each amplification stage in this manner, linearity requirements can be satisfied because amplification in each stage can be controlled so that the produced signal does not saturate subsequent stages; and noise requirements can be satisfied because the signal can be amplified substantially as early as possible in the system without causing saturation.

In various embodiments, in a gain assignment optimized for linearity performance, the amount of amplification can be determined consecutively in each amplification stage. Starting with the last stage and proceeding to the first stage, amplification can be increased in each stage until one of two conditions are met: (1) a maximum preferred level of amplification for the respective amplification stage is reached, or (2) the power of the signal at the output of the stage reaches a predetermined maximum power level, which predetermined maximum power level can be selected so that saturation of subsequent components is prevented. In various embodiments, the signal power at the output of a stage can be measured in a component such as a power detector and/or an RSSI. Amplification can be increased consecutively in each preceding amplification stage in the series until one of the two conditions are met in each amplification stage or the total desired amount of amplification in all amplification stages, combined, is reached.

In various embodiments, in a gain assignment optimized for noise performance, the amount of amplification can be determined consecutively in each of the amplification stages. Starting with the first stage and proceeding to the last stage, amplification can be increased in each stage until one of two conditions are met: (1) a maximum preferred level of amplification for the amplification stage is reached, or (2) the power of the signal at the output of the stage reaches a predetermined maximum power level, which predetermined maximum power level can be selected so that saturation of subsequent components is prevented. In various embodiments, the signal power at the output of a stage can be measured in a component such as a power detector and/or an RSSI. Amplification can be increased consecutively in each succeeding amplification stage in the series until one of the two conditions are met in each amplification stage or the total desired amount of amplification in all amplification stages, combined, is reached.

Figure 3:
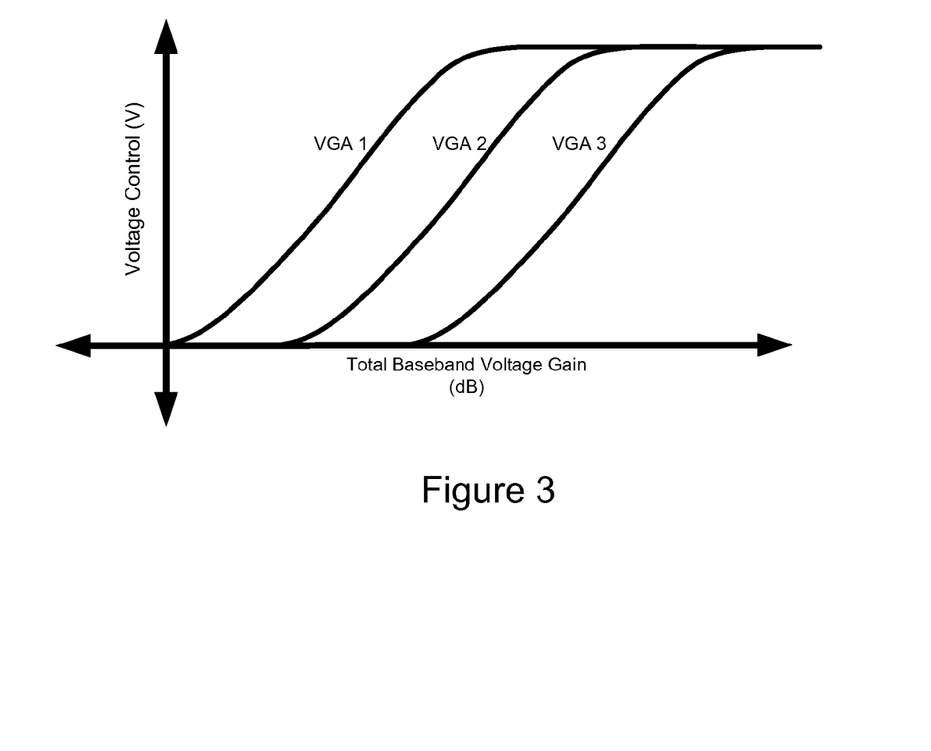
FIG. 3 is a graphical illustration of an example of gain assignment produced by a Gain Control Unit for a low power signal, in accordance with one embodiment.

FIG. 3 is a graphical illustration of an example of gain assignment produced by a Gain Control Unit for a low power signal, in accordance with one embodiment. The example illustrated can be implemented in a corresponding configuration of components as described in FIG. 2. In FIG. 3, the y-axis (Voltage Control) represents the control voltage that can be supplied to a VGA stage by a Gain Control Unit to adjust the level of gain in the corresponding VGA. Accordingly, as the control voltage supplied to a VGA stage is increased or decreased, the level of amplification in that VGA stage increases or decreases respectively. The x-axis (Total Baseband Voltage Gain) represents the total gain that can be produced by all three VGAs. The curves labeled VGA1, VGA2, and VGA3 represent the relationship between the total desired gain (x-axis) and the control voltage that can be supplied to corresponding VGAs to produce the desired gain. Hence, once a Gain Control Unit estimates that a low power signal is present, it can distribute gain in amplification stages according to a gain assignment such as the one illustrated in the example. The total amount of gain applied in the gain assignment can be controlled so that the power of the produced signal is at a fixed preferred value, for example by applying a feedback loop based on the measured power of the produced signal, as described above.

Thus, to determine the control voltage to be supplied to each VGA to produce a desired amount of total gain under the selected gain assignment, we can draw a vertical line on the graph of FIG. 3 at the point on the x-axis corresponding to the desired amount of total gain. From the points where the vertical line intersects the VGA curves, we can draw horizontal lines to the y-axis. The locations on the y-axis where the horizontal lines intersect the axis correspond to the control voltages that should be supplied to the corresponding VGA stages to produce the desired amount of total gain for the particular gain assignment. Namely, for the low power undesired signal component gain assignment illustrated in FIG. 3, if the total gain required is very low, then a vertical line drawn from the x-axis will only intersect the VGA1 curve. Hence, a corresponding voltage to achieve the required amount of amplification will be supplied to VGA1 and a nominal control voltage will be supplied to VGA2 and VGA3. As the required total gain becomes larger, the vertical line moves further to the right, at which point it will intersect the VGA2 curve as well as the VGA1 curve. At this point, the total required gain will be achieved by supplying control voltages corresponding to the intersections of the vertical line with the VGA1 curve and the VGA2 curve to the first and second VGA stages, respectively; nominal control voltage will be supplied to VGA3. As the required total gain becomes still larger, the vertical line moves further to the right, at which point it will intersect with the VGA3 curve as well as the VGA2 and the VGA1 curves. At this point, the total required gain will be achieved by supplying control voltages corresponding to the intersection of the vertical line with the VGA1 curve, the VGA2 curve, and the VGA3 curve to the first, second, and third VGA stages, respectively. It should be noted that where the VGA curves become flat on top is where the corresponding VGA has reached maximum amplification. As FIG. 3 illustrates, in the situation where there is a low power signal, gain can be assigned with a bias towards producing more amplification in the earlier amplifiers in the series than in the later amplifiers in the series. This way, more amplification can be performed prior to full filtering, thereby improving noise performance of the baseband section.

Figure 4:
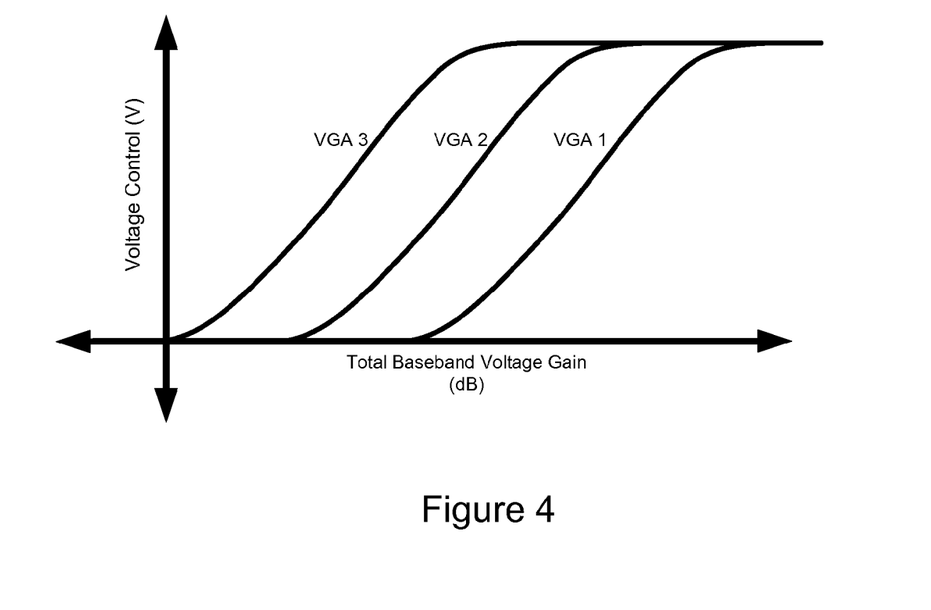
FIG. 4 is a graphical illustration of an example of gain assignment produced in a Gain Control Unit for a signal with a high power undesired signal component, in accordance with one embodiment.

FIG. 4 is a graphical illustration of an example of gain assignment produced in a Gain Control Unit for a signal with a high power undesired signal component, in accordance with one embodiment. As the example of the figure shows, for the high power undesired signal component gain assignment illustrated, if the total gain required is very low, then a vertical line drawn from the x-axis will only intersect the VGA3 curve. Hence, the indicated control voltage to achieve the required amount of amplification will be supplied to VGA3 and a nominal control voltage will be supplied to VGA1 and VGA2. As the required total gain becomes larger, the vertical line moves to the right, at which point it will be intersecting the VGA2 curve as well as the VGA3 curve. At this point, the total required gain will be achieved by supplying control voltages corresponding to the intersections of the vertical line with the VGA3 curve and the VGA2 curve to the third and second VGAs, respectively; nominal control voltage will be supplied to VGA1. As the required total gain becomes still larger, the vertical line moves further to the right, at which point it will intersect with the VGA1 curve as well as the VGA2 and the VGA3 curves. At this point, the total required gain will be achieved by supplying control voltages corresponding to the intersection of the vertical line with the VGA1 curve, the VGA2 curve, and the VGA3 curve to the first, second, and third VGA stages, respectively. It should be noted that where the VGA curves become flat on top is where the corresponding VGA has reached maximum amplification. As FIG. 4 illustrates, in the situation where there is a high power undesired signal component, gain can be assigned with a bias towards producing more amplification in the later amplifiers in the series than in the earlier amplifiers in the series. This way, more filtering can be performed prior to full amplification, thereby decreasing signal distortion and preventing saturation of system components.

FIG. 3 and FIG. 4 are illustrations of particular gain assignments that can be applied in the mentioned corresponding scenarios. An infinite continuum of gain assignments can exist between and outside of the corresponding scenarios of FIGS. 3 and 4. Namely, the gain assignment in the baseband section can vary continuously with variations in performance requirements of the baseband section. For instance, initially, a signal can have a low power adjacent channel and the gain assigned in the baseband section can be similar to the assignment displayed in FIG. 3. If the power of the adjacent channel begins to increase, the gain assignment can change so that the VGA curves move into new positions approximating more the assignment displayed in FIG. 4. For example, as the power of the adjacent channel increases, the VGA3 curve in FIG. 3 can move to the left and the VGA1 curve can move to the right. This can continue until both curves cross the VGA2 curve and the resulting gain assignment approximates the assignment of FIG. 4.

The graphical representations of gain assignments illustrated in FIG. 3 and FIG. 4 refer to configurations with three VGA stages. In an embodiment, similar graphical representations can be applied in configurations with different amplification stages, such as Combination stages. In various other embodiments, analytically similar graphical representations can be applied in configurations with different numbers of amplification stages, where a curve can represent each amplification stage. For instance, a gain assignment for a configuration with six amplification stages can be represented by graphs similar to the graphs illustrated in FIG. 3 and FIG. 4 where there are six curves in each figure, instead of three.

Figure 5:
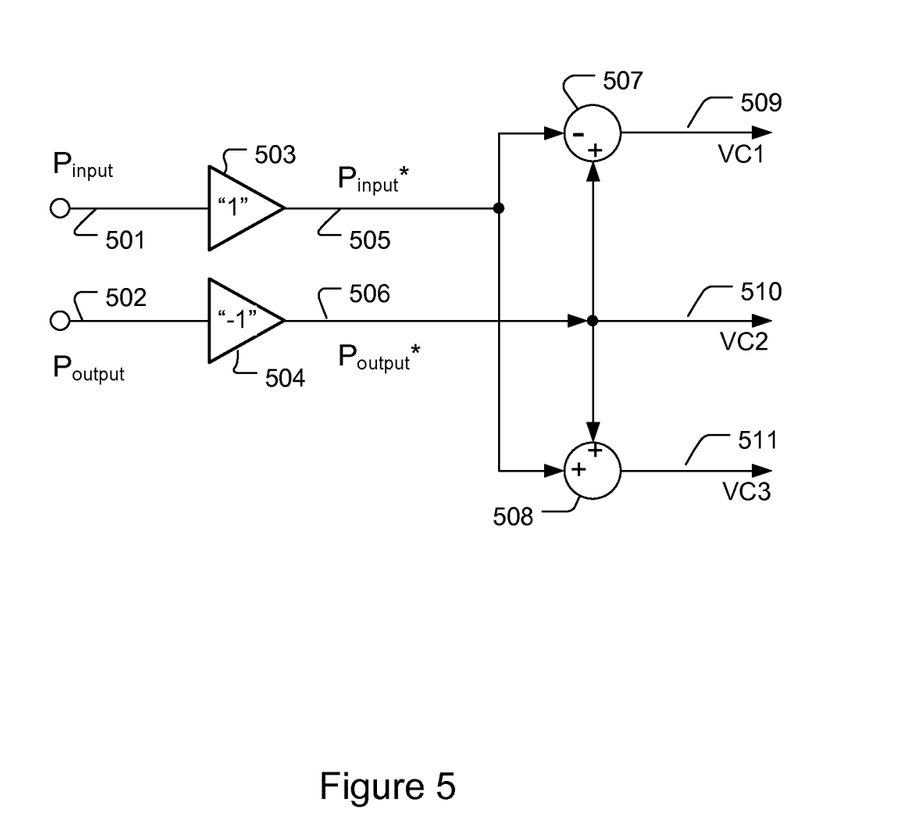
FIG. 5 shows an example of a circuit that can be incorporated in a Gain Control Unit for performing gain assignment, in accordance with one embodiment.

FIG. 5 shows an example of a circuit that can be incorporated in a Gain Control Unit for performing gain assignment, in accordance with one embodiment. The circuit illustrated in FIG. 5 can be applied in a baseband section with three VGA stages as illustrated in FIG. 2. In the example illustrated, the input $P_{input}$ 501 can correspond to the power of the signal before the signal is amplified and filtered in amplification and filter stages. The input $P_{input}$ 501 can be conveyed to the circuit from a RSSI. The input $P_{output}$ 502 can correspond to the power of the signal after the signal is amplified and filtered. $P_{output}$ 502 can be conveyed to the circuit from a RSSI or from a digital demodulator. Outputs of the circuit can be control voltages VC1 509, VC2 510, and VC3 511 that control the gain applied to the signal in a first, second, and third VGA stage, respectively. In an embodiment, the control voltages can control the gain applied to the signal in amplification stages, such as Combination stages. $P_{input}$ 501 can be conveyed to an amplifier or a multiplier 503 where $P_{input}$ 501 can be multiplied by a constant or processed to calibrate and/or adjust the signal before it is conveyed to further components, producing the signal $P_{input}$* 505. As the symbol "1" indicates, the processing in the amplifier or multiplier 503 can be done so the resulting signal is positively correlated with $P_{input}$ 501. For example, the signal $P_{input}$ 501 can be multiplied by 0.2 in the multiplier to produce $P_{input}$* 505. Similarly, $P_{output}$ 502 can be conveyed to an amplifier or a multiplier 504 where $P_{output}$ 502 can be multiplied by a constant or processed to calibrate and/or adjust the signal before it is conveyed to further components, producing the signal $P_{output}$* 506. As the symbol "−1" indicates, the calibration and/or adjustment in the amplifier or multiplier 504 can be done so the resulting signal after calibration or adjustment is inversely correlated with $P_{output}$ 502. For example, the signal $P_{output}$ 502 can be multiplied by −0.2 in the multiplier to produce $P_{output}$* 506. The signal $P_{input}$* 505 can be conveyed to a first adder 507, where the control voltage for VC1 509 can be determined and to a second adder 508, where the control voltage for VC3 511 can be determined. The signal $P_{output}$* 506 can be conveyed to the first adder 507 and to the second adder 508. $P_{output}$* 506 can be conveyed directly to the second VGA stage, hence, $P_{output}$* 506 can directly set the control voltage VC2 510. The components may be electronically connected as illustrated. The control voltage VC1 509 can be determined by subtracting $P_{input}$* 505 from $P_{output}$* 506 in the first adder 507. The control voltage VC3 can be determined by adding $P_{input}$* 505 to $P_{output}$* 506 in the second adder 508. Hence, the signal $P_{input}$* 505 can change the amplification in the first and third VGA stages. For example, if the input RSSI shows a high power input signal, then a high $P_{input}$* 505 will cause less gain in VGA1 stage and more gain in VGA3 stage. Because a high power input signal can cause saturation of components, it can be favorable to perform more of the amplification in the later components, after the signal has been at least partially filtered; hence, by decreasing the gain in VGA1 stage and increasing the gain in VGA3 stage, the circuit can produce a desired gain assignment. Conversely, if the input RSSI shows a low power input signal, then a low $P_{input}$* 505 will cause more gain in VGA1 stage and less gain in VGA3 stage. Because it can be favorable for noise performance to amplify a weak signal prior to filtering it, performing more amplification before filtering by increasing the gain in VGA1 stage and decreasing the gain in VGA3 stage can produce a desired gain assignment. The case of a strong undesired signal components and the case of a weak undesired signal component are described above; however, it will be apparent, to one skilled in the art, that a continuum of gain assignments can be implemented between and outside of the cases described, and the described cases are provided for the purpose of illustration and not intended to limit this disclosure.

Further, because an increase in the signal power $P_{input}$ 501 either increases amplification in the VGA1 stage by the same amount that the signal power $P_{input}$ 501 decreases amplification in the VGA3 stage or decreases amplification in the VGA1 stage by the same amount that it increases amplification in the VGA3 stage, the effect of the signal power $P_{input}$ 501 on the total amount of amplification in the VGA stages can cancel out. Hence, the total amount of amplification in the baseband section can be determined by the signal power $P_{output}$ 502. Thus, the circuit can produce a feedback loop that will fix the power of the output signal of the baseband section based on the power measurement $P_{output}$ 502. Namely, as described above, $P_{output}$ 502 can correspond to the power of the signal at the output of the baseband section. Because $P_{output}$ 502 can be inversely correlated with $P_{output}$* 506, an increase in $P_{output}$ 502 can cause a decrease in $P_{output}$* 506. Conversely, a decrease in $P_{output}$ 502 can cause an increase in $P_{output}$* 506. Hence, since the signal power $P_{output}$* 506 determines the total gain produced, an increase in the output signal can induce less amplification in the baseband section and a decrease in the output signal can induce more amplification in the baseband section. Thus, a feedback loop can be implemented that fixes the output signal power of the baseband section at a preferred value.

In various embodiments, gain assignment in the baseband section can be performed in components different from, or in addition to, those recited in the described embodiments. For example, as will be apparent to those skilled in the art, the described methods and systems for performing gain assignment can be implemented in any components capable of distributing gain and filtering functions in a baseband portion, without straying from the scope of this disclosure.

In various embodiments, a baseband section can comprise Combination stages that can be any independent filter portion, such as a biquad, further incorporating a VGA. Incorporating VGAs in independent filter portions, such as filter biquads, can have the advantage of consuming less power, saving chip area, and/or improving noise and linearity characteristics by decreasing the total number of stages in the device. VGAs can be incorporated in a filter stage by incorporating a variable component in the circuitry of the filter stage such as a biquad. In various embodiments, the variable components incorporated in the circuitry of the filter stage can be resistors, transconductors, buffers, or capacitors.

Figure 6:
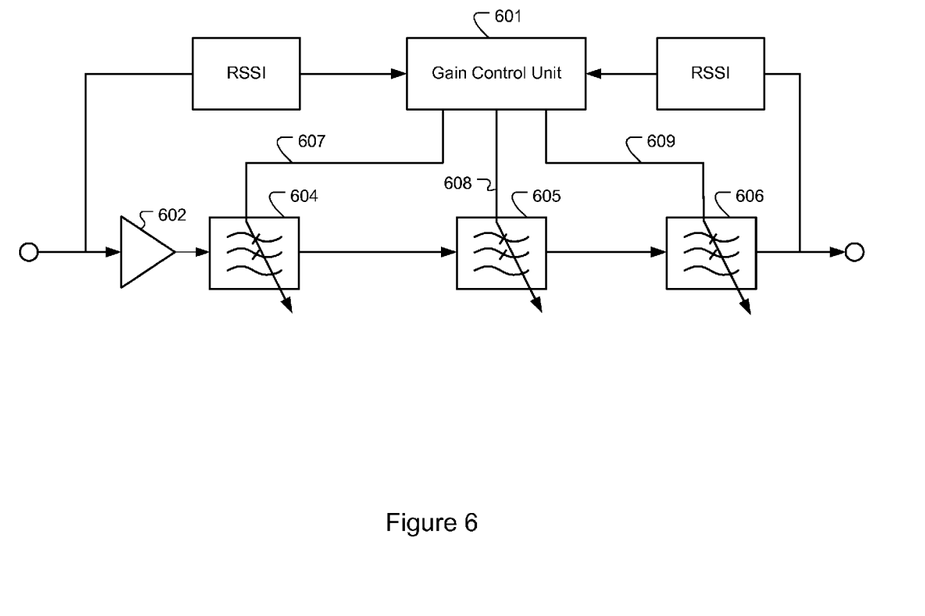
FIG. 6 shows an example of a baseband section comprising three Combination stages, in accordance with one embodiment.

FIG. 6 shows an example of a baseband section comprising three Combination stages, in accordance with one embodiment. In the example illustrated, the principles, functions, and the components can be identical to the corresponding principles, functions, and components described in FIG. 2, with the exception that the series of VGA stages and filter stages in FIG. 3 are replace by a series of Combination stages in FIG. 6. Hence, after a pre-amplifier stage 602, a signal can be conveyed to a first Combination stage 604, a second Combination stage 605, and a third Combination stage 606. Each Combination stage can perform variable gain amplification and filtering of the signal. To implement gain assignments, a Gain Control Unit 601 can send control voltage signals 607, 608, and 609 to respective Combination stages 604, 605, and 606 to set the level of amplification in the Combination stages. The systems, methods, and principles described above for designing baseband sections and producing gain assignments can be applicable to a baseband section comprising Combination stages as well as a baseband section comprising VGA stages and filter stages.

Figure 7:
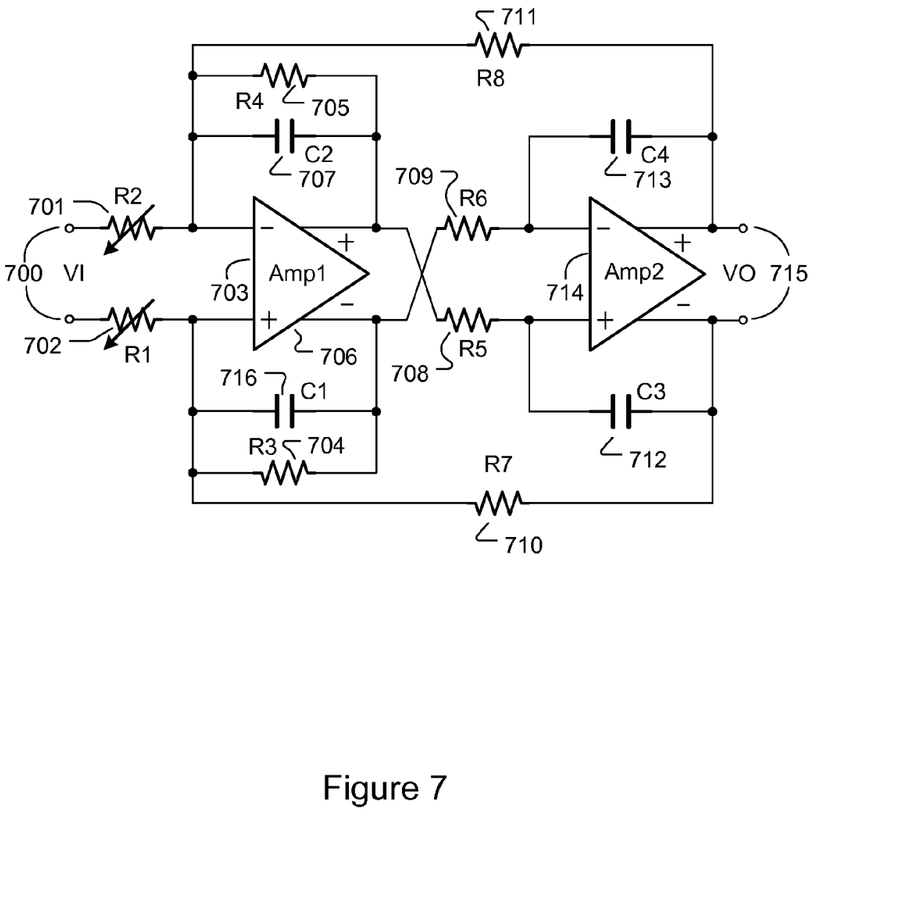
FIG. 7 shows an example of a Combination stage comprising an op-amp based biquad with adjustable amplification, in accordance with various embodiments.

FIG. 7 shows an example of a Combination stage comprising an op-amp based biquad with adjustable amplification, in accordance with various embodiments. The example of a Combination stage illustrated in the figure can be implemented in a baseband section such as the baseband section illustrated in FIG. 6 in place of the Combination stages 604, 605, and 606. In the example illustrated, R1 702 and R2 701 can be variable resistors; R3 704, R4 705, R5 708, R6 709, R7 710, and R8 711 can be resistors; C1 716, C2 707, C3 712, and C4 713 can be capacitors; Amp1 703 and Amp2 714 can be operational amplifiers; VI 700 can be input signal terminals; and VO 715 can be output signal terminals. The components may be electronically connected as illustrated. A signal may be received at the input terminals VI 700 and amplified and filtered in the biquad. A resulting amplified and filtered signal can be produced at the output terminals VO 715. The DC gain of the biquad can change directly with the transconductance of R1 702 and R2 701. A Gain Control Unit, such as the Gain Control Unit 210 in FIG. 2 and the Gain Control Unit 601 in FIG. 6, respectively, can control the amount of gain produced in the Combination stage by sending a control voltage signal to vary the transconductance in resistors R1 702 and R2 701.

In various embodiments, gain assignment can be implemented through logic, such as executable logic, digital circuits, and/or analog circuits incorporated in a Gain Control Unit. In one embodiment, gain change can be performed in an amplification stage through fully digital switching, such as by switching "on" and "off" resistors and/or other components in the amplification stage. In another embodiment, gain change can be performed continuously in an amplification stage through analog control, for example, by adjusting components such as passive resistors, active resistors, transconductors, and/or capacitors. In yet another embodiment, gain change can be performed in an amplification stage by combining digital switching and analog control, for example, by having large increments of total gain change performed by digital switching, and by having small variations, or finetuning, of total gain control performed by continuous analog controls. An example of combined digital switching and analog control will be illustrated in FIG. 8.

Because signals at the input of a stage can be high power, a highly linear Combination stage is desirable for minimizing signal distortion. Hence, components, including variable resistors, in a Combination stage should be substantially linear. In one embodiment, variable resistors can be implemented with MOS transistors. However, the linear region of variable resistors, such as variable resistors implemented through MOS transistors, can be limited.

To overcome the limited linear range of various variable components, several variable components can be implemented in series or in parallel such that each component can operate within its linear range and such that the components can be bypassed, modulated, or turned "on" or "off" to allow a large, continuous, and linear range of variable amplification or resistance.

For example, a switching resistor array can be implemented in a variable resistor to achieve substantial linearity throughout a large range of variable resistance. Such a switching resistor array can comprise a plurality of passive resistors configured so that the signal is conveyed through the resistors in series and/or in parallel and a plurality of bypass paths configured so that at least one resistor can be bypassed, for example, by closing a switch on the path containing the resistor. The switches can be transistors that work as switches. The switches can be activated by respective control signals. In an embodiment, the switches can also be modulated between the "on" and "off" positions to achieve intermediate levels of resistance. The system can be configured so that the resistance across the variable resistor can be controlled by controlling the switches with the respective control signals.

In another embodiment, a variable resistor can comprise a switching resistor array that contains a plurality of active resistors, such as MOS transistors, configured so that the signal is conveyed through the active resistors in series and/or in parallel. An active resistor can be turned "on" or "off" or modulated between the "on" and "off" positions to control the resistance across the active resistor. The active resistors and the variable resistor can be configured so that resistance of the variable resistor is controlled by changing the resistance across the active resistors. For example, a variable resistor can contain a plurality of parallel paths, wherein each parallel path contains an active resistor, which active resistor can be controlled by a corresponding control signal. In another embodiment, a variable resistor can contain a plurality of active resistors in series, which active resistors can be controlled by corresponding control signals. Resistance across the variable resistor can be varied by controlling the resistance across the individual active resistors by modulating the resistors or turning the resistors "on" or "off" through corresponding control signals.

Figure 8:
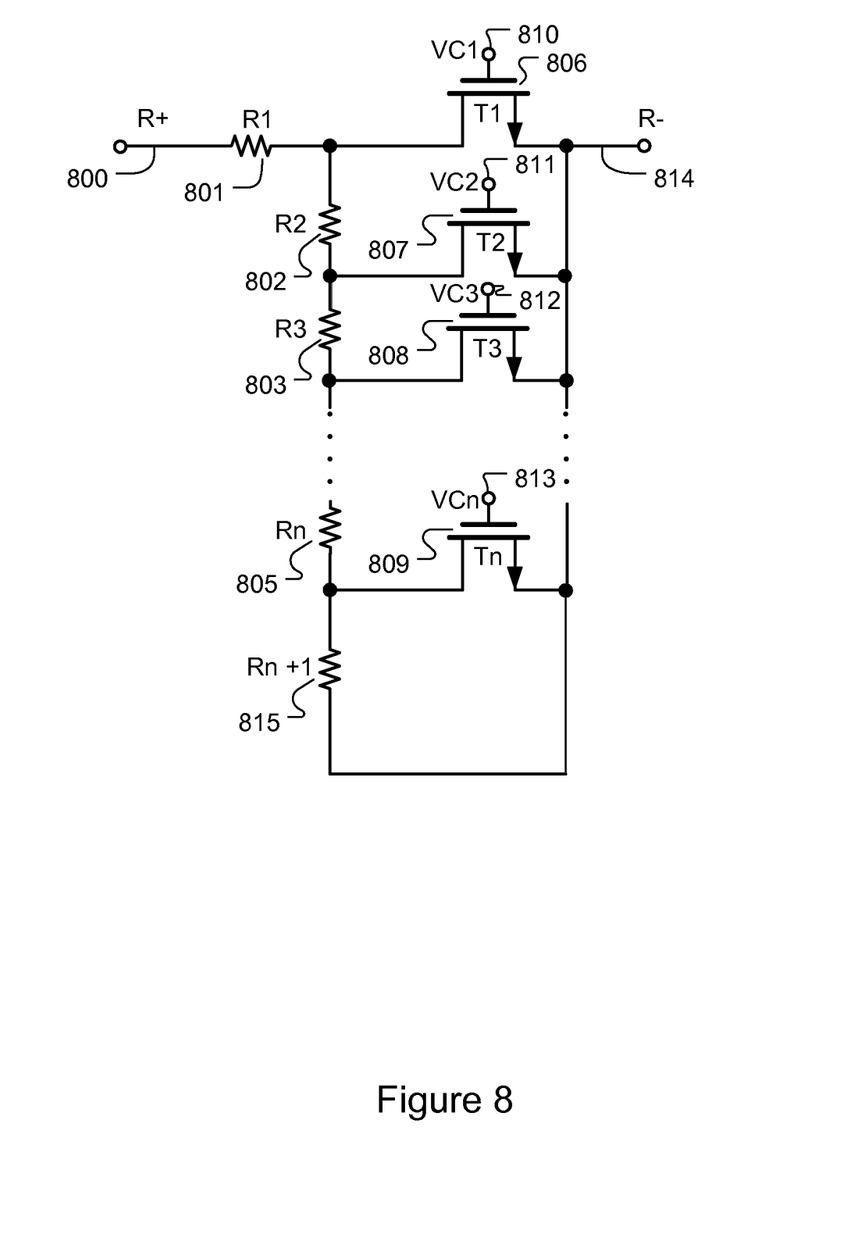
FIG. 8 shows an example of a variable resistor that implements a switching resistor array, in accordance with one embodiment.

FIG. 8 shows an example of a variable resistor that implements a switching resistor array, in accordance with one embodiment. Such a variable resistor can be used in a Combination stage, such as the resistors R1 702 and R2 701 in the Combination stage of FIG. 7. In the example illustrated, R+ 800 can be a signal input, R− 814 can be a signal output; R1 801, R2 802, R3 803, Rn 805, and Rn+1 815 can be resistors; VC1 810, VC2 811, VC3 812, and VCn 813 can be control voltages; T1 806, T2 807, T3 808, and Tn 809 can be NMOS switches. The components may be electronically connected as illustrated. As shown in the example, the signal input R+ 800 and the signal output R− 814 can be connected by "n" parallel paths with each path containing a corresponding transistor which can be turned "off" or "on" by a corresponding control voltage signal. For instance, the first path can contain the transistor T1 806, which transistor can be controlled by the control signal VC1 810. The second path can contain the transistor T2 807, which transistor can be controlled by the control signal VC2 811. The second path can also be separated from first path by a resistor R2 802. This pattern can continue until the nth path, which can contain the transistor Tn 809, which transistor can be controlled by the control signal VCn 813. The nth path can also be separated from the previous path by a resistor Rn 805. For example, in various embodiments, the variable resistor can contain 6 to 12 parallel paths with transistors, the number of paths can be based on the range and linearity requirements of the resistor, where more paths can produce more range and linearity. Each resistor from R2 802 to Rn+1 815 can be bypassed by turning "on" an NMOS switch that comes before the resistor in the series. Hence, bypassing a resistor can also bypass all resistors below the bypassed resistor in the series. For example, if all switches are in the "on" position, turning "on" switch T2 807 will bypass resistors R3 803 through Rn 805. In addition, intermediate levels of resistance can be achieved if a switch is modulated between the "off" and "on" position. Namely, if switches T1 806 and T2 807 are in the "off" position, and switches T3 808 to Tn 809 are in the "on" position, the total resistance, Rt1, can be Rt1=R1+R2+R3. If switch T1 806 is in the "off" position, and switches T2 807 through Tn 809 are in the "on" position, the total resistance, Rt2, can be Rt2=R1+R2. A resistance level between Rt1 and Rt2 can be achieved by modulating switch T2 807 between the "off" and "on" position.

In various embodiments, minimum resistance can be achieved by bypassing resistors R2 802 through Rn+1 815. For instance, this can be done by turning "on" switch T1 806. In such a configuration, minimum resistance can result in maximal gain in a buffer incorporating the variable resistor. Conversely, maximum resistance can be achieved by not bypassing any resistors. For instance, by keeping all switches in the "off" position. Maximum resistance can result in minimal gain in a Combination stage incorporating the variable resistor. Bypassing some resistors and not others can result in levels of resistance between the maximum and minimum resistance and accordingly in levels of gain between the maximum and minimum gain.

In various embodiments, the switches T1 806 through Tn 809 can be turned "off" and "on" by respective control voltage signals VC1 810 through VCn 813. The control voltage signals can be conveyed to the variable resistors from a Gain Control Unit, such as the Gain Control Unit 210 in FIG. 2 and the Gain Control Unit 601 in FIG. 6. The Gain Control Unit can produce the Transistor Control Voltage signals VC1 through VCn to control the respective transistors T1 through Tn based on a Main Control Voltage signal. The Main Control Voltage signal can be a signal generated in the device, which signal's voltage can correspond to the required amplification of the Combination stage and hence to the level of resistance in the variable resistor. Hence, the Transistor Control Voltage signals VC1 through VCn can be produced based on the Main Control Voltage signal so that the level of resistance in the variable resistor corresponds to the Main Control Voltage in a direct relationship.

Figure 9:
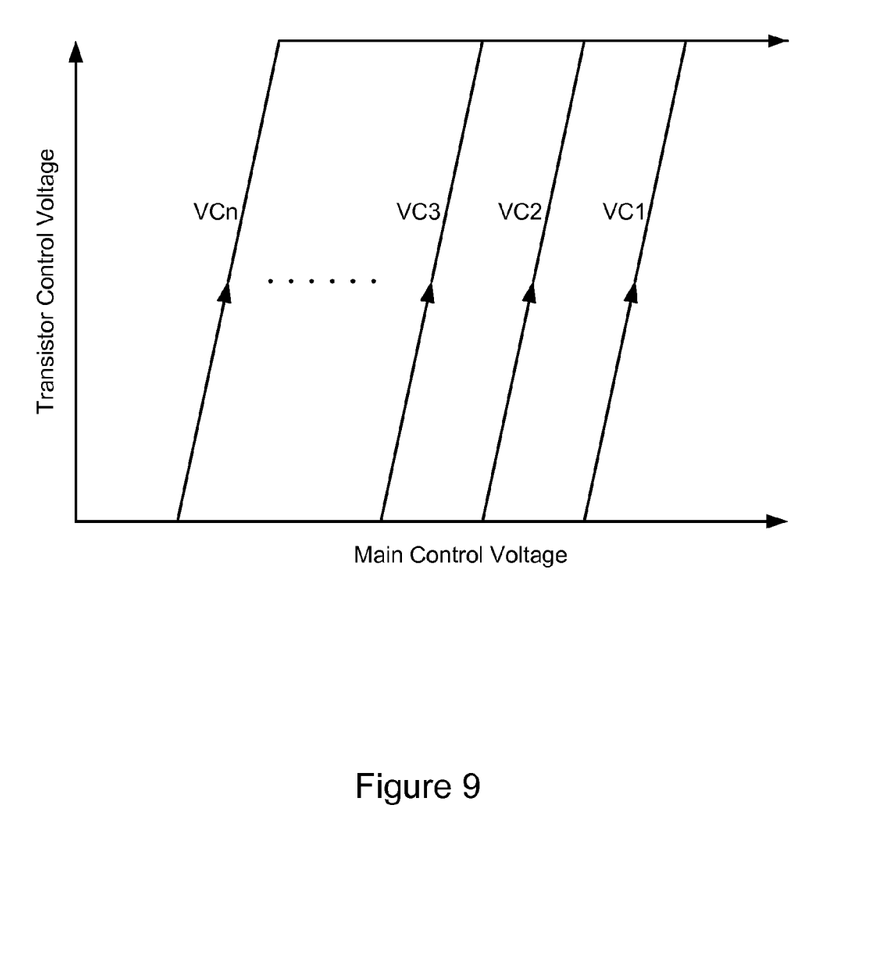
FIG. 9 illustrates, in graphical form, an example of how Transistor Control Voltage signals VC1 through VCn can be produced based on the Main Control Voltage signal.

FIG. 9 illustrates, in graphical form, an example of how Transistor Control Voltage signals VC1 through VCn can be produced based on the Main Control Voltage signal. The Transistor Control Voltage signals VC1 through VCn can be conveyed to respective transistors in a variable resistor, such as the transistors T1 through Tn in FIG. 8. In the example illustrated, when the Main Control Voltage is at a nominal value, near the origin on the x-axis, the Transistor Control Voltage is also at a nominal value, hence the transistors T1 through Tn can be in an "off" position, which can produce minimum amplification by producing maximum resistance in the respective variable resistor. As the Main Control Voltage increases from a nominal value, the Transistor Control Voltage VCn can begin to increase. Where the VCn curve is sloped, the transistor can be in a state of modulation where it is between the "on" an "off" position and a corresponding modulated state of resistance can be achieved by, for example, partially bypassing a respective resistor. As the Main Control Voltage continues to increase, the VCn curve flattens out where the transistor is in the full "on" position, which can, for example, result in the complete bypassing of a resistor, for example the resistor Rn+1 815 in FIG. 8. As the Main Control Voltage continues to increase, a subsequent transistor can begin to be modulated and a corresponding modulated state of resistance can be achieved by, for example, partially bypassing a resistor. As the Main Control Voltage continues to increase further, the curve flattens out where the transistor is in the full "on" position, which can, for example, result in the complete bypassing of a resistor. As the Main Control Voltage continuously increases, all Transistor Control Voltages from the VCn to VC1 can be at a maximum, which can cause the respective transistors Tn through T1 to be in the "on" position, which can result in least resistance in the variable resistance and a maximum level of amplification in the stage containing the variable resistor.

While certain exemplary embodiments have been described and shown in the accompanying drawings, it is to be understood that such embodiments are merely illustrative of and not restrictive on the broad invention as defined in the appended Claims and other Claims that may be later presented, and that this invention is not limited to the specific constructions and arrangements shown and described, since various other modifications may occur to those ordinarily skilled in the art. Hence, alternative arrangements and/or quantities of amplifiers, filters, RSSIs, power detectors, transmission paths, and other components can occur without departing from the spirit and scope of the invention. Similarly, components not explicitly mentioned in this specification can be included in various embodiments of this invention without departing from the spirit and scope of the invention. Also, functions and logic described as being performed in certain components in various embodiments of this invention can, as would be apparent to one skilled in the art, be readily performed in whole or in part in different components or in different configurations of components not explicitly mentioned in this specification, without departing from the spirit and scope of the invention. Accordingly, the specification and drawings are to be regarded in an illustrative rather than a restrictive sense.

While certain exemplary embodiments have been described and shown in the accompanying drawings, it is to be understood that such embodiments are merely illustrative of and not restrictive on the broad invention, and that this invention is not limited to the specific constructions and arrangements shown and described, since various other modifications may occur to those ordinarily skilled in the art. Accordingly, the specification and drawings are to be regarded in an illustrative rather than a restrictive sense.

Reference in the specification to "an embodiment," "one embodiment," "some embodiments," "various embodiments" or "other embodiments" means that a particular feature, structure, or characteristic described in connection with the embodiments is included in at least some embodiments, but not necessarily all embodiments. References to "an embodiment," "one embodiment," or "some embodiments" are not necessarily all referring to the same embodiments. If the specification states a component, feature, structure, or characteristic "may," "can," "might," or "could" be included, that particular component, feature, structure, or characteristic is not required to be included. If the specification or Claims refer to "a" or "an" element, that does not mean there is only one of the element. If the specification or Claims refer to an "additional" element, that does not preclude there being more than one of the additional element.

The invention claimed is:

1. An apparatus for amplifying and filtering a signal in the baseband portion of a receiver, comprising:
    a series of stages including at least two amplification stages, where each amplification stage is one of (a) a variable gain amplifier (VGA) stage or (b) a Combination stage that combines the VGA stage and a filter stage in one stage, wherein the series of stages is configured as one of:
        two or more variable gain amplifier (VGA) stages and a filter stage located between the two or more VGA stages;
        two or more Combination stages;
        a Combination stage and a VGA stage; or
        a Combination stage, a VGA stage, and a filter stage located between the Combination stage and the VGA stage; and
    a Gain Control Unit that varies gain assignment in the amplification stages according to measured signal strength by distributing a total amount of gain among the amplification stages;
    where the Gain Control Unit is configured to produce the gain assignment based on an estimate of a desired component of the signal and an estimate of an undesired component of the signal;
    where the Gain Control Unit is configured to estimate one of: the power of the desired component of the signal and the power of the undesired component of the signal by comparing a predicted power of the signal after the signal has been amplified and filtered with a measured power of the signal after the signal has been amplified and filtered;
    where the predicted power of the signal is determined by measuring a power of the signal before the signal is amplified and filtered and applying a function of the amplification applied in the amplification and filtering to the measured power of the signal before the signal is amplified and filtered, where the function estimates the power of the signal after the signal is amplified and filtered based on the power of the signal before the signal is amplified and filtered and based on the amount of amplification applied to the signal in the amplification and filtering; and
    where the difference between the predicted power and the measured power of the signal after the signal is amplified and filtered represents the power of the undesired signal component; and
    where the difference between the measured signal power after the signal is amplified and filtered and the power of the estimated undesired signal component represents the power of the desired signal component.

2. The apparatus of claim 1, where the Gain Control Unit is configured such that the total amount of gain is distributed among the amplification stages to control a noise and/or linearity of the signal.

3. The apparatus of claim 2, where the Gain Control Unit is configured to produce the gain assignment that distributes a total amount of gain in amplification stages so that:

to improve signal noise, amplification is increased in an amplification stage and decreased in an amplification stage located later in the series; and to improve signal linearity, amplification is decreased in an amplification stage and increased in an amplification stage located later in the series.

4. The apparatus of claim 1, where the Gain Control Unit is configured such that a gain assignment to improve signal noise is chosen when the measured power of the signal decreases and a gain assignment to improve signal linearity is chosen when the measured power of the signal increases.

5. The apparatus of claim 1, further comprising a feedback loop configured to control the power of the signal by:
  measuring the power of the signal; and
  setting the total amount of gain based on the measured power of the signal.

6. The apparatus of claim 1, where the filter stages are independent filter portions and/or biquads.

7. The apparatus of claim 1, where the VGA in the Combination stage is a variable component incorporated in the Combination stage such that variation in the variable component changes gain of the Combination stage.

8. The apparatus of claim 7, where the variable component comprises a variable resistor, the variable resistor further comprising:
  a plurality of passive resistors configured so that the signal is conveyed through one of: the set of passive resistors in series and the set of passive resistors in parallel;
  at least one bypass path configured so that at least one resistor can be fully or partially bypassed by closing a switch and/or a transistor that works as a switch on the path; and
  where the variable resistor is configured so that resistance in the variable resistor can be controlled by controlling the transistors and/or switches by respective control signals.

9. The apparatus of claim 7, where the variable component comprises a variable resistor, the variable resistor further comprising:
  a plurality of active resistors configured so that the signal is conveyed through one of: the set of active resistors in series and the set of active resistors in parallel;
  where the resistance of the active resistors can be varied by respective control signals; and
  where the resistance in the variable resistor can be controlled by controlling the active resistors by the respective control signals.

10. The apparatus of claim 1, where the Gain Control Unit is configured to produce the gain assignment such that:
  gain is increased in at least one amplification stage until one of: a predetermined maximum level of gain in the amplification stage is reached or the amplitude of the signal at the output of the amplification stage reaches a predetermined maximum amplitude.

11. A method for amplifying and filtering a signal in the baseband portion of a receiver comprising:
  processing the signal in a series of stages including at least two amplification stages, where each amplification stage is one of (a) a variable gain amplifier (VGA) stage or (b) a Combination stage that combines the VGA stage and a filter stage in one stage, wherein the processing includes one of:
    amplifying the signal in one or more variable gain amplifier (VGA) stages and filtering the signal in a filter stage located between the two or more VGA stages;
    amplifying and filtering the signal in two or more Combination stages;
    amplifying and filtering the signal in a Combination stage and amplifying the signal in a VGA stage; or
    amplifying and filtering the signal in a Combination stage, amplifying the signal in a VGA stage, and filtering the signal in a filter stage located between the Combination stage and the VGA stage; and
  varying a gain assignment in the amplification stages according to measured signal strength by a Gain Control Unit that distributes a total amount of gain among the amplification stages;
  where the Gain Control Unit is configured to produce the gain assignment based on an estimate of a desired component of the signal and an estimate of an undesired component of the signal;
  where the Gain Control Unit is configured to estimate one of: the power of the desired component of the signal and the power of the undesired component of the signal by comparing a predicted power of the signal after the signal has been amplified and filtered with a measured power of the signal after the signal has been amplified and filtered;
  where the predicted power of the signal is determined by measuring a power of the signal before the signal is amplified and filtered and applying a function of the amplification applied in the amplification and filtering to the measured power of the signal before the signal is amplified and filtered, where the function estimates the power of the signal after the signal is amplified and filtered based on the power of the signal before the signal is amplified and filtered and based on the amount of amplification applied to the signal in the amplification and filtering; and
  where the difference between the predicted power and the measured power of the signal after the signal is amplified and filtered represents the power of the undesired signal component; and
  where the difference between the measured signal power after the signal is amplified and filtered and the power of the estimated undesired signal component represents the power of the desired signal component.

12. The method of claim 11, where the total amount of gain is distributed among the amplification stages to control the noise and/or linearity of the signal.

13. The method of claim 12, where a total amount of gain in a gain assignment is distributed in amplification stages so that:
  to improve signal noise, amplification is increased in an amplification stage and decreased in an amplification stage located later in the series; and
  to improve signal linearity, amplification is decreased in an amplification stage and increased in an amplification stage located later in the series.

14. The method of claim 11, where a gain assignment to improve signal noise is chosen when the measured power of the signal decreases and a gain assignment to improve signal linearity is chosen when the measured power of the signal increases.

15. The method of claim 11, where the power of the signal is controlled in a feedback loop by:
  measuring the power of the signal; and
  setting the total amount of gain based on the measured power of the signal.

* * * * *